United States Patent

Fujimura (10) Patent No.: US 6,422,879 B2
(45) Date of Patent: Jul. 23, 2002

(54) IC SOCKET FOR SURFACE-MOUNTING SEMICONDUCTOR DEVICE

(75) Inventor: Takuma Fujimura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/789,963

(22) Filed: Feb. 22, 2001

(30) Foreign Application Priority Data

Feb. 23, 2000 (JP) ....................................... 2000-045831

(51) Int. Cl.⁷ ................................................. H01R 4/58
(52) U.S. Cl. ............................. 439/91; 439/66; 439/71
(58) Field of Search .............................. 439/86, 91, 66, 439/71, 87, 90

(56) References Cited

U.S. PATENT DOCUMENTS

| | | | | |
|---|---|---|---|---|
| 4,729,809 A | * | 3/1988 | Dery et al. | 439/91 |
| 5,001,302 A | * | 3/1991 | Atsumi | 439/91 |
| 5,495,395 A | * | 2/1996 | Yoneda et al. | 439/91 |
| 5,586,892 A | * | 12/1996 | Sato | 439/91 |
| 5,618,188 A | * | 4/1997 | Gilmore et al. | 439/91 |
| 5,967,804 A | * | 10/1999 | Yoshizawa et al. | 439/91 |
| 6,245,175 B1 | * | 6/2001 | Hotta et al. | 439/66 |
| 6,265,673 B1 | * | 7/2001 | Higashida et al. | 439/66 |
| 6,270,363 B1 | * | 8/2001 | Brofman et al. | 439/66 |

FOREIGN PATENT DOCUMENTS

| | | |
|---|---|---|
| JP | 5-62727 | 3/1993 |
| JP | 7-287048 | 10/1995 |
| JP | 9-35789 | 2/1997 |
| JP | 9-161870 | 6/1997 |
| JP | 10-197599 | 7/1998 |
| JP | 11-214594 | 8/1999 |

* cited by examiner

*Primary Examiner*—Tho D. Ta
(74) *Attorney, Agent, or Firm*—McGinn & Gibb, PLLC (57) ABSTRACT

An IC or testing socket is provided, which ensures stable electrical connection of an IC or semiconductor device to be tested to the circuit board of a test apparatus. This socket comprises: (a) a socket body made of a rigid material; the body having penetrating openings; (b) anisotropically conductive members formed in the respective openings of the body; each of the anisotropically conductive members being made of an elastic, insulating material, first conductive particles dispersed in the material, and second conductive particles dispersed in the material; the first and second conductive particles being different in average diameter from each other; and (c) a guide for receiving a semiconductor device to be tested and guiding the device toward the conductive members in the body; the guide being fixed to the body in such a way that electrodes of the device are contacted with the corresponding conductive members in the body.

12 Claims, 5 Drawing Sheets

IC SOCKET FOR SURFACE-MOUNTING SEMICONDUCTOR DEVICE

BACKGROUND OF THE INVENTION

1. Field of the Invention

The present invention relates to a socket used for electrically connecting a semiconductor device, i.e., an Integrated Circuit (IC), to the circuit board of a testing apparatus or system and more particularly, to a socket preferably used for a surface-mounting semiconductor device that comprises electrodes arranged in the form of "area array" at the bottom of its package, in which the electrodes at the package bottom are electrically connected to the circuit board.

2. Description of the Related Art

In recent years, the need of the market to provide semiconductor devices (ICs) with multiple function, high-speed operation, and low power consumption has been becoming stronger. According to this need, the package type of semiconductor devices has been changed. Specifically, instead of the conventional Quad Flat Package (QFP) with electrodes arranged at its periphery, the "area array package" with electrodes arranged at its bottom, such as the Ball Grid Array (BGA) and Land Grid Array (LGA), has been becoming popular. With the area array package, electrodes are arranged at the flat bottom of the package in the form of area array.

Generally, on testing the electrical characteristics of the IC chip encapsulated in the package, the packaged semiconductor device is electrically connected to the circuit board of a specific testing apparatus or system by way of a socket. Conventional sockets (i.e., testing sockets) have typically had the structure comprising a punched metal plate and contact pins fixed to the plate. However, to test a semiconductor device with the area array package, the conventional sockets are unable to provide satisfactory electrical characteristics. Thus, various techniques relating to the testing sockets themselves and materials used therefor have been developed and proposed so far.

For example, the Japanese Non-Examined Patent Publication No. 7-287048 published in 1995 discloses an IC socket designed for ICs with the BGA package. This socket comprises an elastic rubber plate and springy contact pins arranged on the surface of the plate two-dimensionally. However, this socket has a problem that the durability is low. Specifically, the contact pins are likely to be deformed with the increasing operation time. As a result, there is a possibility that the electrodes of the IC or semiconductor device do not contact the pins as desired, degrading the reliability.

The Japanese Non-Examined Patent Publication Nos. 9-35789 and 9-161870 published in 1997 disclose an anisotropically conductive sheet applicable to IC sockets. The sheet comprises an elastic rubber body and thin metal wires buried in the sheet, which have an advantage to provide improved contact with the semiconductor device. However, the sheet has a problem that it is unable to cope sufficiently with the miniaturization of the device and pitch narrowing of its electrodes. This is because the metal wires are arranged obliquely to the direction perpendicular to the sheet itself and as a result, it is difficult to decrease the distance between the contact points on the surface of the sheet.

The Japanese Non-Examined Patent Publication No. 5-62727 published in 1993 discloses an anisotropically conductive connection member applicable to mounting an IC chip on a circuit board or a package. This member comprises an elastic rubber sheet and bunches of metal wires buried in the sheet, where these bunches of wires are selectively provided at positions corresponding to the pads or electrodes of the IC chip and the circuit board or package. This member has an advantage that it can be used for test of IC chips with miniaturized and pitch-narrowed pads/electrodes because the wires are fixed perpendicular to the sheet itself. However, this member has the following problem.

Specifically, the bunches of wires disturb the elastic deformation of the rubber sheet and thus, the intrinsic elastic property of the sheet is damaged. Accordingly, if the member is applied to test of IC chips with the BGA package, excessive force tends to be applied to the ball-shaped terminals or electrodes of the chips. This causes a problem that the terminals/electrodes are likely to be damaged.

Moreover, the Japanese Non-Examined Patent Publication No. 11-214594 published in 1999 discloses an anisotropically conductive sheet applicable to test of IC chips. This sheet comprises an elastic rubber body and conductive particles selectively distributed in the sheet at positions corresponding to the pads or electrodes of the IC chip and the circuit board for test. This sheet has an advantage that it can be used for test of area-array packaged IC chips with miniaturized and pitch-narrowed pads/electrodes.

The Japanese Non-Examined Patent Publication No. 10-197599 published in 1998 discloses a test apparatus of semiconductor devices or ICs. This apparatus comprises an anisotropically conductive sheet and an insulating sheet. The insulating sheet has openings at positions corresponding to the pads or electrodes of the IC chip to be tested. In the testing operation, the insulating sheet is placed between the anisotropically conductive sheet and the IC chip in such a way that the pads/electrodes of the chip are engaged with the openings of the insulating sheet, improving the positioning accuracy of the chip. This apparatus can be used for test of area-array packaged IC chips with miniaturized and pitch-narrowed pads/electrodes.

Figure 1:
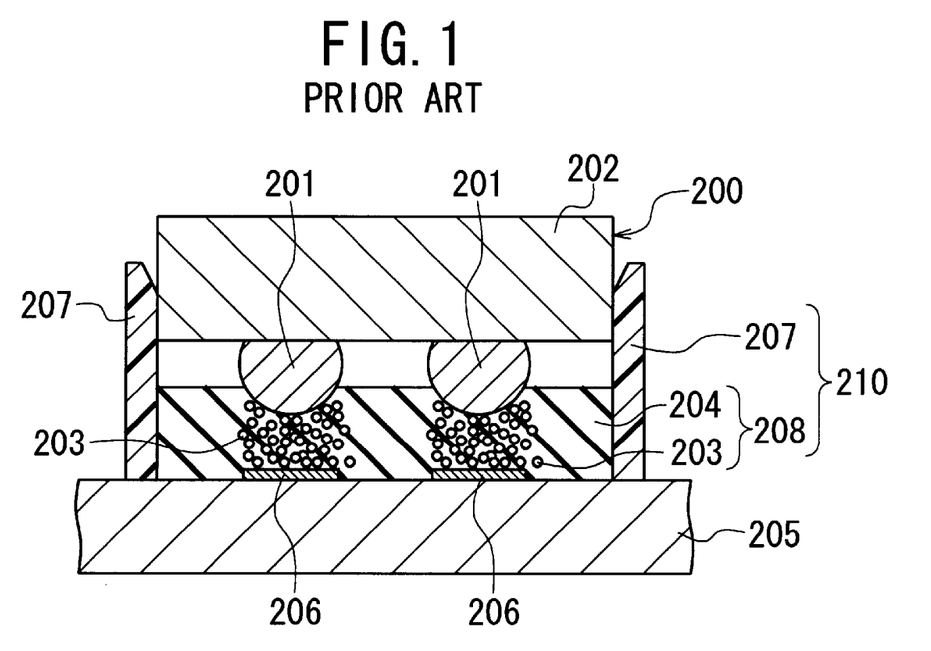
FIG. 1 is a schematic cross-sectional view showing the use of a conventional IC or testing socket.

An example of the conventional IC sockets of this type is shown in FIG. 1, in which the use of the IC socket is illustrated.

As seen from FIG. 1, the conventional IC socket 210 comprises an anisotropically conductive sheet 208 and a frame-shaped package guide 207 surrounding the periphery of the sheet 208. The sheet 208 is formed by an approximately rectangular, sheet-shaped base material (i.e., body) 204 and conductive particles 203 distributed locally therein. The base material or body) 204 is made of an insulating, elastic rubber. The particles 203 are selectively provided at positions corresponding to the electrodes 206 of a circuit board 205 of a test apparatus (not shown) and the solder balls 201 of a semiconductor device, i.e., IC chip 200, to be tested. As the base material 204, silicone rubber or the like may be used. The average diameter of the particles 203 is, for example, several tens micrometers (e.g., 40 $\mu$m).

The package guide 207, which is made of an insulating material, has the same approximately rectangular plan shape as the sheet 208. The size of the guide 207 is so designed that the body 202 of the IC chip 200 is fitted into the guide 207, as shown in FIG. 1.

When the IC chip 202 is subjected to a test on the test apparatus, the chip 202 is electrically connected to the circuit board 205 by way of the anisotropically conductive sheet 208. Specifically, first, the chip 202 is inserted into the guide 207 so that the solder balls 201 are placed on the respective conductive regions (in which the conductive particles are distributed) of the sheet 208, as shown in FIG.

1. Next, a downward pressure is applied to the body 202 of the chip 200, thereby pressing the balls 201 toward the sheet 208 and causing deformation of the conductive regions of the sheet 208. Because of the deformation of the regions, the conductive particles 203 existing in the regions are contacted with each other, forming electrical paths between the balls 201 of the chip 200 and the electrodes 206 of the board 205. As a result, the balls 201 are electrically connected to the corresponding electrodes 206.

Typically, to confirm the position of the bottom ends of the solder balls 201, the bottom ends of the balls 201 may be monitored or checked with a suitable sensor in the test operation. From this point of view, it is necessary that the surfaces of the balls 201 include no or less damages and solder waste.

The conventional IC socket 210 shown in FIG. 1 has an advantage that the solder balls 201 are difficult to be damaged. However, it has the following three problems.

The first problem is that it is difficult to make sure the electrical connection of the chip 200 to the board 205.

Specifically, with the anisotropically conductive sheet 208 of the IC socket 210, the average diameter of the conductive particles 203 is small and thus, the adjoining particles 203 are difficult to contact with each other. Therefore, if the deformation of the base material or rubber 204 of the sheet 208 is insufficient, the electrical resistance in the conductive regions of the sheet 208 does not decrease as desired. This means that desired electrical paths are not formed between the solder balls 201 of the chip 200 and the electrodes 206 of the board 205. As a result, there is a possibility that good chips 200 are likely to be judged defective in error, which raises the fabrication cost of the chips 200.

The second problem is that the durability of the socket 210 is insufficient.

With the anisotropically conductive sheet 208 of the IC socket 210, as described above, if the deformation of the rubber material 204 is insufficient, the electrical resistance in the conductive regions of the sheet 208 does not decrease as desired. Thus, the pressure applied to the body 202 of the chip 200 needs to be large. Moreover, since the application of the pressure needs to be conducted against the elastic force of the material 204, the pressure will be rather large. In this case, the repetitive application of the large pressure to the material 204 for a long time induces plastic deformation in the material 204. As a result, the solder balls 201 are difficult to contact the material 204 as desired, which means the degradation of the socket function.

Furthermore, when such the large pressure as above is applied to the body 202 of the IC chip 200, a lot of solder waste tends to be adhered to the contact surfaces of the material 204 with the balls 201. In this case, the solder waste thus adhered to the material 204 is oxidized and accordingly, the electrical connection between the balls 201 and the regions of the sheet 208 is prevented, thereby accelerating the degradation of the socket function.

Thus, the insufficient durability will cause frequent exchange of the socket 210, which raises the testing cost.

The third problem is that the test is difficult to be carried out stably at high temperatures.

When the IC chip 200 is subjected to the so-called burn-in test, it is kept at a high-temperature atmosphere for test. At this time, the sheet 208 tends to deform (e.g., warp or bend), resulting in electrical connection failure between the chip 200 and the socket 210. This prevents desired, stable measurement.

SUMMARY OF THE INVENTION

Accordingly, an object of the present invention is to provide an IC or testing socket that ensures stable electrical connection of an IC or semiconductor device to a connection part of a test apparatus.

Another object of the present invention is to provide an IC or testing socket having a desired good durability.

Still another object of the present invention is to provide an IC or testing socket that makes it possible to conduct a desired test stably even at high temperatures.

A further object of the present invention is to provide an IC or testing socket that reduces the testing cost.

The above objects together with others not specifically mentioned will become clear to those skilled in the art from the following description.

According to the present invention, a socket for testing a semiconductor device with electrodes at its bottom is provided. This socket comprises:

(a) a socket body made of a rigid material; the body having penetrating openings;

(b) anisotropically conductive members formed in the respective openings of the body;

each of the anisotropically conductive members being made of an elastic material, first conductive particles dispersed in the material, and second conductive particles dispersed in the material;

the first and second conductive particles being different in average diameter from each other; and (c) a guide for receiving a semiconductor device to be tested and guiding the device toward the conductive members in the body;

the guide being fixed to the body in such a way that electrodes of the device are contacted with the corresponding conductive members in the body.

With the socket according to the present invention, each of the anisotropically conductive members formed in the respective penetrating openings of the socket body is made of the elastic material. The first and second conductive particles are dispersed in the material, where the first and second conductive particles are different in average diameter from each other.

Thus, the first and second conductive particles are easily contacted with each other in the elastic material even if the applied pressure to the device toward the body is low. This means that electrical conductivity between the electrodes of the device and the connection part of a test apparatus is enhanced, which improves the test reliability.

Also, since the first and second conductive particles are easily contacted with each other in the material even with low applied pressure, there is no need to press strongly the electrodes of the device to the corresponding conductive members. As a result, solder waste is difficult to adhere to the surface of the conductive members. This means that the socket is scarcely affected by the defective insulation due to oxidation of the solder waste on the surface of the conductive members.

Moreover, when the conductive members are worn out, it is sufficient that only the members thus worn out are replaced with new ones.

The socket body is made of a rigid material such as metal, the socket is difficult to deform due to heat.

As described above, (i) stable electrical connection of the semiconductor device to the connection part (e.g., circuit board) of a test apparatus is ensured, (ii) a desired good durability is realized, (iii) a desired test can be conducted stably even at high temperatures, and (iv) the testing cost is reduced.

In a preferred embodiment of the invention, the socket body and the anisotropically conductive members are electrically insulated from each other by electrically insulating films formed on inner faces of the openings of the body.

In another preferred embodiment of the invention, the first particles and the second particles are approximately spherical. In this case, it is preferred that the average diameter of the first particles is in the range from 60 μm to 200 μm while the average diameter of the second particles is in the range from 1 μm to 30 μm. Within this range, the anisotropically conductive members have better anisotropic conductivity.

In still another preferred embodiment of the invention, the first particles are approximately ellipsoidal. In this case, if the ellipsoidal first particles are oriented in a direction approximately perpendicular to the electrodes of the semiconductor device. There is an additional advantage that the socket is suitable to ICs or semiconductor devices with the LGA type package that have approximately flat electrodes.

The average shorter diameter of the ellipsoidal first particles is preferably in the range from 30 μm to 80 μm and the average longer diameter thereof is preferably in the range from 300 μm to 1000 μm. The second particles are preferably approximately spherical. The average diameter of the second particles is preferably in the range from 1 μm to 30 μm.

It is preferred that the anisotropically conductive members are formed to protrude from a surface of the body in a space of the guide. In this case, there is an additional advantage that the contact between the conductive members and the approximately flat electrodes of the device or IC with the LGA type package is improved.

As the elastic, insulating material of the anisotropically conductive members, any elastic, insulating rubber may be used. Preferably, for example, any thermosetting resin with elasticity, such as styrene-butadiene rubber, acrylonitrile-butadiene rubber, butadiene rubber, isoprene rubber, chloroprene rubber, butyl rubber, silicone rubber, fluorine rubber, and polyurethane rubber, may be used.

In a further preferred embodiment of the invention, electrically insulting films are additionally formed on inner surfaces of the respective openings of the body. The insulating films are located between the inner surfaces of the openings and the corresponding conductive members.

As the electrically insulating films, any electrically insulating material may be used. Preferably, for example, any thermosetting resin with electrical insulation property, such as epoxy resin, polyimide resin, styrene-butadiene rubber, acrylonitrile-butadiene rubber, butadiene rubber, isoprene rubber, chloroprene rubber, butyl rubber, silicone rubber, fluorine rubber, and polyurethane rubber, may be used.

As each of the first and second conductive particles of the anisotropically conductive members, any particles of any metal, such as gold (Au), nickel (Ni), silver (Ag), copper (Cu), and tungsten (W), or Au-plated Ni particles may be used.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described in detail below while referring to the drawings attached.

First Embodiment

Figure 2:
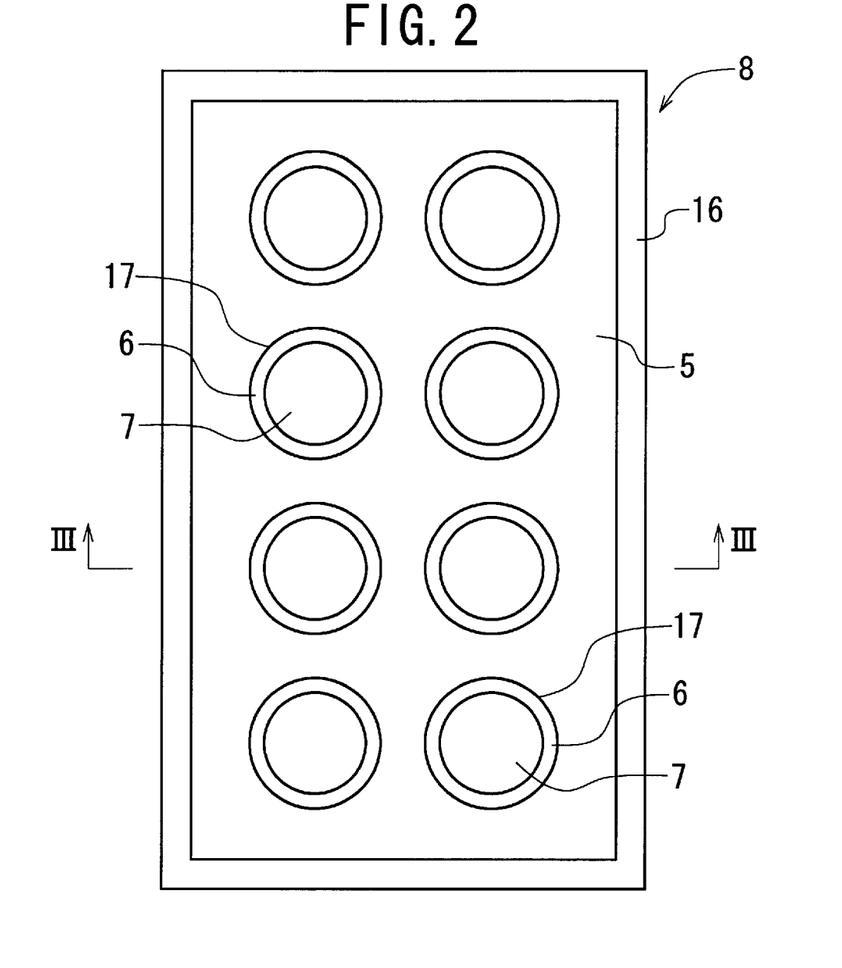
FIG. 2 is a schematic plan view showing the configuration of an IC or testing socket according to a first embodiment of the invention.
Figure 3:
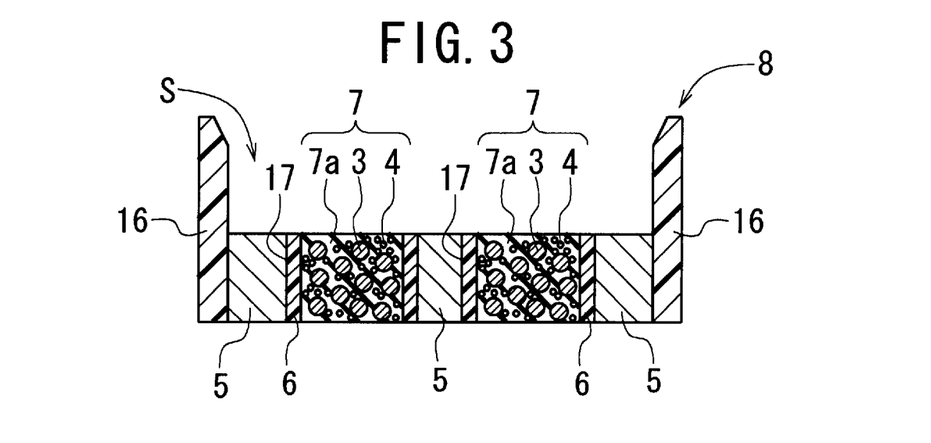
FIG. 3 is a schematic cross-sectional view of the socket according to the first embodiment of FIG. 1, which is taken along the line III—III in FIG. 2.

As shown in FIGS. 2 and 3, an IC or testing socket according to a first embodiment of the invention comprises a rectangular-plate-shaped socket body 5 having circular penetrating holes 17 at the specific positions, electrically insulating films 6 fixed on the inner faces of the respective holes 17 to cover entirely the same faces, cylindrical anisotropically conductive members 7 buried in the respective holes 17 by way of the insulating films 6, and a guide 16 fixed to the body 5 so as to surround the whole periphery thereof. Eight holes 17 and eight members 7 are shown in FIGS. 2 and 3; however, actually, any other holes 17 and members 7 are formed. The other ones are omitted here for the sake of simplification of description.

The socket body 5 is made of a rigid, metal plate. The holes 17 are arranged in a matrix array on the body 5. The diameter of each hole 17 is determined according to the size of the bumps or electrodes of an IC or semiconductor device to be tested.

Each of the anisotropically conductive members 7 is made of an elastic, insulating rubber material 7a, first conductive particles 3, and second conductive particles 4. The first conductive particles 3 and the second conductive particles 4 are dispersed in the material 7a approximately uniformly. The first and second particles 3 and 4, which are approximately spherical, have different average diameters from each other. Each of the conductive members 7 is electrically insulated from the body 5 by the corresponding insulating resin film 6. Each of the holes 17 is filled with the corresponding member 7 and film 6.

The guide 16, which is made of an insulating material, is frame-shaped and has an approximately rectangular plan shape. One end of the guide 16 is protruded upward from the surface of the body 5. Thus, a space S, into which an IC or semiconductor device to be tested is inserted, is formed in the guide 16. The size of the guide 16 is determined in such a way that the IC or device to be tested is fitted into the space S and is slidable by a downward pressing force toward the body 5.

As the metal of the socket body 5, a plate with a thickness of 0.1 to 0.5 mm of aluminum (Al), Al alloy, copper (Cu), copper-zinc (Cu—Zn) alloy, stainless steel, or the like may be used.

Any popular drilling method may be used to form the penetrating holes 17 in the body 5.

As the rubber material 7a of the anisotropically conductive members 7, any rubber material maybe used. Preferably, for example, any thermosetting resin with elasticity, such as styrene-butadiene rubber, acrylonitrile-butadiene rubber, butadiene rubber, isoprene rubber, chloroprene rubber, butyl rubber, silicone rubber, fluorine rubber, and polyurethane rubber, may be used.

As each of the first and second conductive particles 3 and 4 of the member 7, any particles of any metal, such as gold (Au), nickel (Ni), silver (Ag), copper (Cu), and tungsten (W). Alternately, Au-plated Ni particles may be used.

The average diameter of the first particles 3 is preferably in the range from 60 $\mu$m to 200 $\mu$m while the average diameter of the second particles 4 is preferably in the range from 1 $\mu$m to 30 $\mu$m. The mixing ratio of the second particles 4 with respect to the first particles 3 is preferably in the range from 1 to 10 in weight. This is to realize high anisotropic conductivity for this purpose.

The ratio of the first and second particles 3 and 4 with respect to the rubber material 7a is preferably in the range from 20% to 60% in volume. This is to ensure the desired elastic property of the rubber material 7a.

The insulating film 6 may be made of any electrically insulating material. Preferably, for example, any thermosetting resin, such as polyimide resin, may be used. Alternately, any one of the above-described thermosetting resins, such as styrene-butadiene rubber, acrylonitrile-butadiene rubber, butadiene rubber, isoprene rubber, chloroprene rubber, butyl rubber, silicone rubber, fluorine rubber, and polyurethane rubber, may be used.

The film 6 may be formed by any method. Preferably, it may be formed by a known electropainting method of any one of the above-described thermosetting resins, where the thermosetting resin is coated so as to be a thin film on the whole inner face of each hole 17. Alternately, it may be formed by a known screen-printing method, where the thermosetting resin is filled into the hole 17 and cured under heat and then, a smaller hole is formed to penetrate the resin thus cured by a known laser drilling method.

Next, a concrete example of the IC socket 8 according to the first embodiment is explained below.

First, an Al-alloy plate with a thickness of 0.2 mm is prepared. Then, the penetrating holes 17 with the same diameter of 0.25 mm are formed in the plate by a known drilling method using a Numerical-Control (NC) drilling machine. Thus, the socket body 5 is formed.

Next, an electrically insulating thermosetting epoxy resin is filled into the holes 17 of the body 5 and cured under heat. The protruding part of the epoxy resin thus cured from the holes 17 are polished for planarization. Smaller penetrating holes with a diameter of 0.15 mm are formed in the epoxy resin thus cured in the holes 17 using a carbon dioxide ($CO_2$) laser. Thus, the insulating films 6 with a thickness of about 50 $\mu$m are formed on the inner faces of the holes 17.

Subsequently, the first conductive particles 3 (the average diameter: 60 $\mu$m) and the second conductive particles 4 (the average diameter: 2 $\mu$m) are mixed together in a liquid-phase thermosetting silicone rubber, forming a paste. As each of the first and second particles 3 and 4, metallic Ni particles plated with Ag are used. The mixing ratio of the combination of the particles 3 and 4 with respect to the silicone rubber is approximately 50% in volume. The ratio of the second particles 4 with respect to the first particles 3 is 5 in weight.

Furthermore, the paste thus formed is filled into the inner spaces of the holes 17 surrounded by the insulating films 6 by a screen-printing method. The paste thus filled is then heated for curing. The protruding part of the cured paste from the spaces are polished for planarization. Thus, the anisotropically conductive members 7 made of the elastic rubber 7a and the first and second particles 3 and 4 are formed in the respective holes 17.

Finally, the socket body 5 is fixed to the guide 16 that has been formed in advance, resulting in the IC socket 8 according to the first embodiment.

The IC socket 8 according to the first embodiment is used in the following way.

Figure 4A:
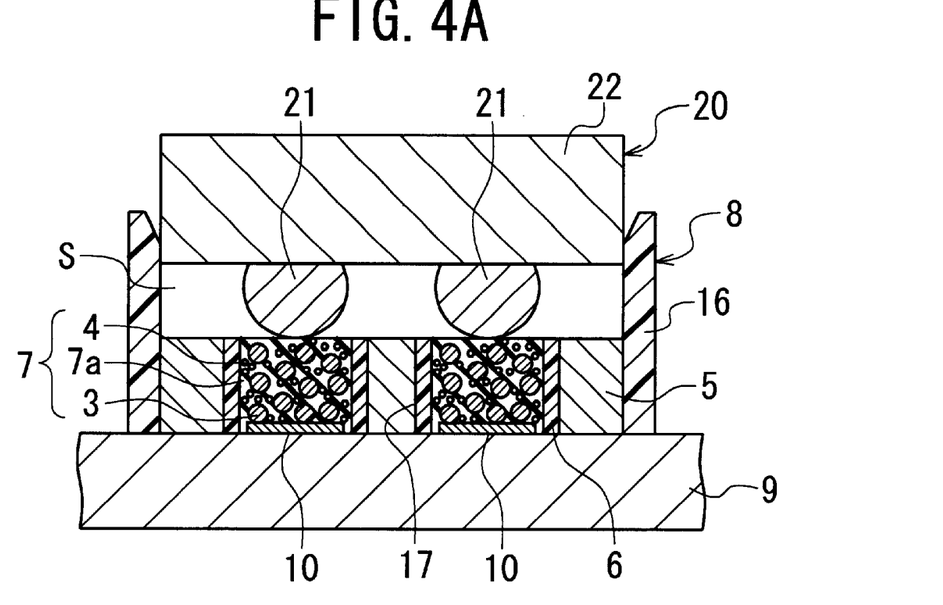
FIGS. 4A and 4B are schematic cross-sectional views showing the use of the socket according to the first embodiment of FIGS. 2 and 3, respectively, which is taken along the line III—III in FIG. 2.

Here, the IC or semiconductor device 20 to be tested, which has the BGA type package, comprises the body 22 and the solder balls (i.e., the conductive bumps) 21 attached onto the flat bottom of the body 22. The socket S is attached to the circuit board 9 of a test apparatus in such a way that the bottoms of the anisotropically conductive members 7 are contacted with the corresponding electrodes 10 of the board 9.

First, the circuit board 9 to which the socket 8 has been attached is mounted on a testing apparatus (not shown, e.g., so-called LSI tester). Then, the IC or device 20 to be tested is set on the socket B using a transporting device for the chip 20, which is termed the handler. Specifically, the device 20 and the socket 8 are aligned, as shown in FIG. 4A, and then, the device 20 is lowered to enter the space S in the guide 16. Thus, the solder balls 21 of the device 20 are contacted with the tops of the corresponding conductive members 7.

Figure 4B:
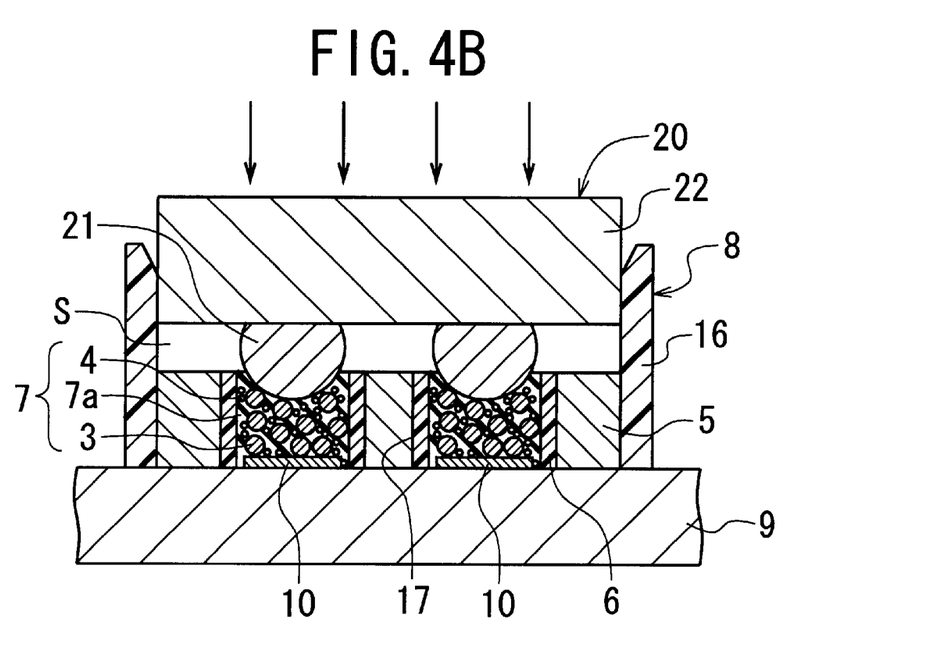

Thereafter, as shown in FIG. 4B, a downward pressure is applied to the body 22 of the device 20 using the handler, thereby pressing the balls 21 against the members 7. Due to the pressure thus applied, the rubber materials 7a of the members 7 are elastically deformed downward and at the same time, the device 20 is shifted downward according to the elastic deformation of the materials 7a. At this time, other displacements of the device 20 than the vertical displacement are prevented from occurring by the guide 16.

In the conductive members 7 thus deformed, the first and second conductive particles 3 and 4 are displaced in the rubber materials 7a according to their deformation, contacting easily the adjoining first and second particles 3 and 4 with each other. In particular, since the first particles 3 are larger in average diameter than the second particles 4, the first particles 3 are higher in density than the second particles 4. Thus, the contact between the first and second particles 3 and 4 occurs well if only the first particles 3 are moved or displaced slightly. This means that the necessary deformation of the members 7 for causing desired contact between the first and second particles 3 and 4 needs not so large.

When the first and second particles 3 and 4 are contacted with each other at a lot of positions, a lot of electrical paths are formed between the solder balls 21 of the device 20 and the electrodes 10 of the circuit board 9, resulting in electrical connection between the balls 21 and the electrodes 10. Thus, the device 20 is held in the desired testing state where the device 20 can be subjected to electrical evaluation or inspection.

In the testing state, specific electrical signals are supplied to the board 9 from the testing apparatus, evaluating or inspecting the device 20.

With the IC or testing socket 8 according to the first embodiment of FIGS. 2 and 3, as explained above, the anisotropically conductive members 7 are filled in the corresponding holes 17 of the socket body 5. Each of the members 7 is made of the elastic rubber material 7a, the first conductive particles 3 with a relatively larger diameter, and the second conductive particles 4 with a relatively smaller diameter. Therefore, slight deformation of the members 7 induces the desired contact between the first and second particles 3 and 4, thereby forming the electrical paths between the solder balls 21 and the electrodes 10. Thus, the IC or device 20 is surely connected to the board 5.

Furthermore, since it is sufficient to induce slight deformation of the members 7, the necessary pressure applied to the members 7 (i.e., the pressure applied to the device 20) can be reduced. Thus, the plastic deformation of the rubber materials 7a of the members 7 is suppressed and at the same time, the solder waste is prevented from adhering to the materials 7a. Accordingly, the durability of the socket 8 is improved and the testing cost is lowered.

Since the socket body 5 is made of the rigid metal plate, the warping or bending of the socket 8 is prevented or suppressed Thus, stable test can be carried out even at high temperatures, which means that any burn-in test can be performed.

In addition, if the socket 8 is used for a long time, the members 7 are worn down. In this case, however, it is sufficient that only the worn members 7 are replaced with new ones. This means that partial repair of the socket 8 can be realized, lowering the testing cost.

Second Embodiment

Figure 5:
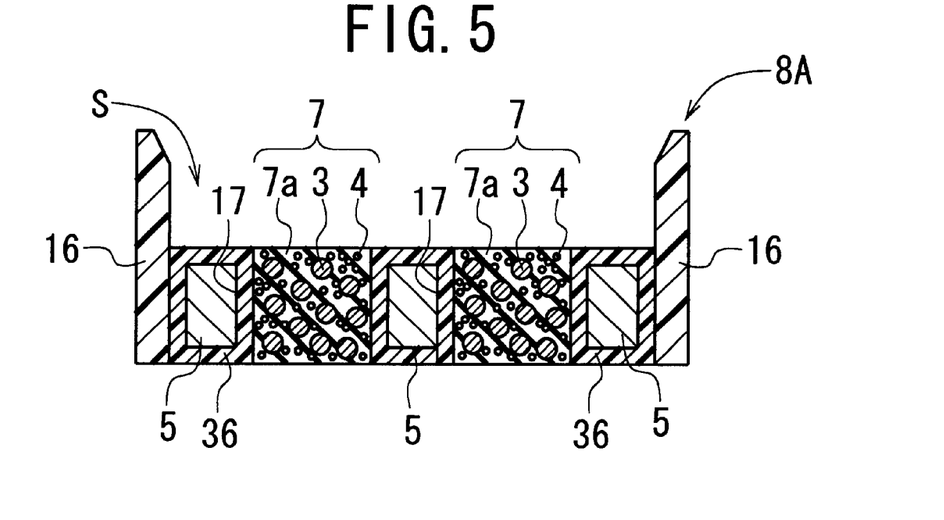
FIG. 5 is a schematic cross-sectional view of an IC or testing socket according to a second embodiment of the invention, which is taken along the line III—III in FIG. 2.

FIG. 5 shows an IC or testing socket 8A according to a second embodiment of the invention, which comprises the same configuration as the socket 8 according to the first embodiment, except that the exposed areas of the socket body 5 are covered with a dielectric resin film 36. Therefore, the description about the same configuration is omitted here by attaching the same reference symbols as those in the first embodiment for the sake of simplification of description in FIG. 5.

As shown in FIG. 5, with the IC socket 8A, all the exposed areas of the body 5 (i.e., the upper and lower surfaces and outer side face of the body 5 and the inner faces of the holes 17) are covered with the film 36. Thus, compared with the socket 8 according to the first embodiment, the electrical insulation between the body 5 and the device 20 and between the body 5 and the board 9 is improved. This means that the reliability is enhanced in the testing operation of the device 20.

Next, a concrete example of the IC socket 8A according to the second embodiment is explained below.

First, an Al-alloy plate with a thickness of 0.2 mm is prepared. Then, the penetrating holes 17 with the same diameter of 0.25 mm are formed in the plate by a known drilling method using a NC drilling machine. Thus, the socket body 5 is formed.

Next, an electrically insulating thermosetting epoxy resin is coated on the exposed surfaces of the body 5 and the holes 17 by an electroprinting method and cured under heat. Thus, the insulating resin film 36 with a thickness of about 40 $\mu$m is formed to cover the entire exposed areas of the body 5.

Subsequently, the first conductive particles 3 (the average diameter: 60 $\mu$m) and the second conductive particles 4 (the average diameter: 2 $\mu$m) are mixed together in a liquid-phase thermosetting silicone rubber, making a paste. As each of the first and second particles 3 and 4, metallic Ni particles plated with Ag are used. The mixing ratio of the combination of the particles 3 and 4 with respect to the silicone rubber is approximately 50% in volume. The ratio of the second particles 4 with respect to the first particles 3 is 5 in weight.

Furthermore, the paste thus made is filled into the inner spaces of the holes 17 surrounded by the insulating films 36 by a screen-printing method. The paste thus filled is then heated for curing. The protruding part of the cured paste from the holes 17 are polished for planarization. Thus, the anisotropically conductive members 7 made of the elastic rubber 7a and the first and second particles 3 and 4 are formed in the respective holes 17.

Finally, the socket body 5 is fixed to the guide 16 that has been formed in advance, resulting in the IC socket 8A according to the second embodiment.

Figure 6:
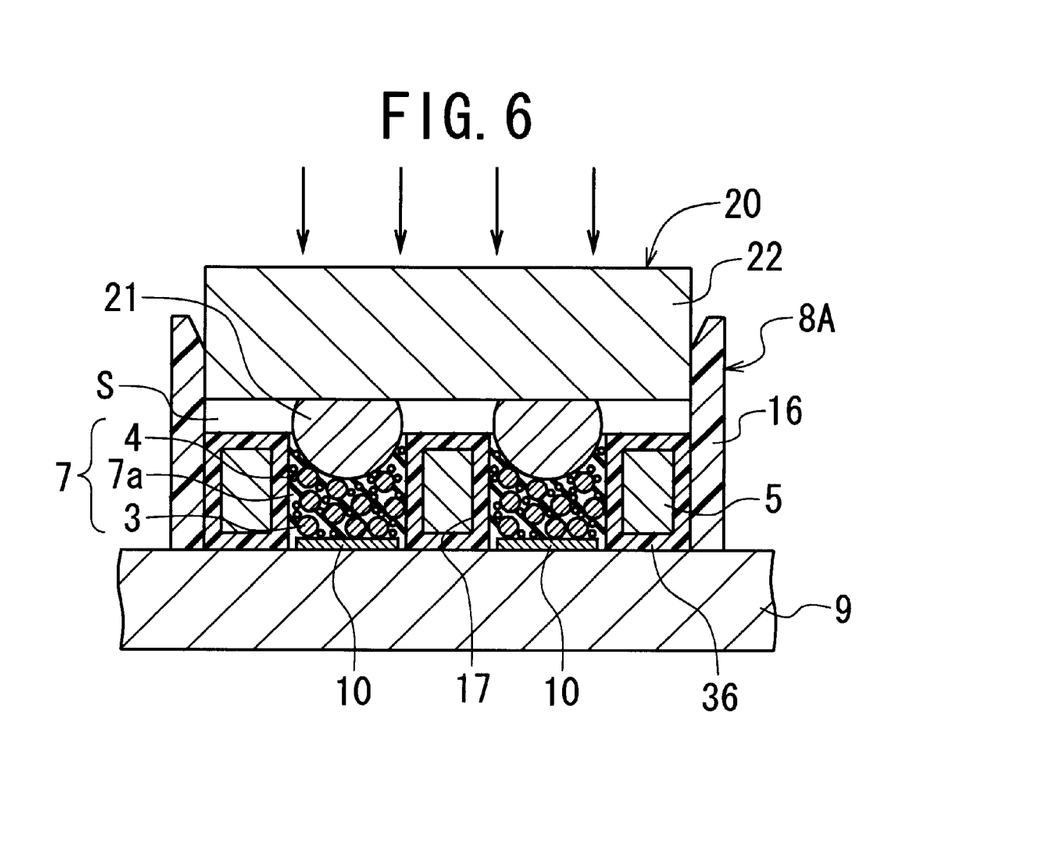
FIG. 6 is a schematic cross-sectional view showing the use of the socket according to the second embodiment of FIG. 5, which is taken along the line III—III in FIG. 2.

The IC socket 8A according to the second embodiment is used in the same way as the socket 8 according to the first embodiment and therefore, the explanation is omitted here.

With the IC socket 8A according to the second embodiment of FIG. 5, as explained above, there are the same advantages as those of the socket 8 according to the first embodiment.

Third Embodiment

Figure 7:
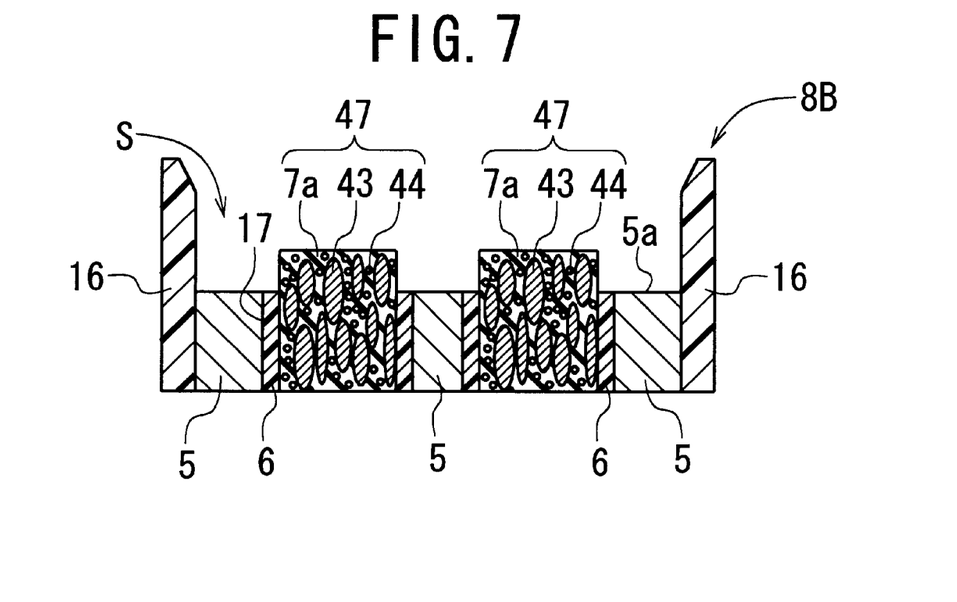
FIG. 7 is a schematic cross-sectional view of an IC or testing socket according to a third embodiment of the invention, which is taken along the line III—III in FIG. 2.

FIG. 7 shows an IC or testing socket 8B according to a third embodiment of the invention, which comprises the same configuration as the socket 8 according to the first embodiment, except that anisotropically conductive members 47 are filled into the respective holes 17 of the body 5 in such a way that the tops of the members 47 are protruding from the holes 17. Therefore, the description about the same configuration is omitted here by attaching the same reference symbols as those in the first embodiment for the sake of simplification of description in FIG. 7.

The socket 8B is designed for ICs or semiconductor devices with the LGA type package. For this purpose, as shown in FIG. 7, the tops of the conductive members 47 are protruding from the holes 17. This is unlike the sockets 8 and 8A according to the first and second embodiments.

Each of the anisotropically conductive members 47 is made of the elastic, insulating rubber material 7a, first conductive particles 43, and second conductive particles 44. The first conductive particles 43 and the second conductive particles 44 are dispersed in the material 7a. The first particles 43 are approximately ellipsoidal while the second particles 44 are approximately spherical. The first particles 43 have a larger average diameter from the second particles 44. The longitudinal axes of the first particles 43 are oriented so as to be approximately perpendicular to the surfaces of the electrodes or lands 25 of the IC 20' and the electrodes 10 of the circuit board 9. Thus, even if the IC 20' is of the LGA type without the solder balls, a desired, sufficient pressure is applied to the members 47 from the lands 25 of the IC 20'. As a result, the IC 20' with the LGA type package is surely connected to the board 9.

As each of the first and second conductive particles 43 and 44 of the member 47, like the first and second embodiments, any particles of any metal, such as Au, Ni, Ag, Cu, and W, or Ni particles plated with Au, Ag, or Cu may be used.

The average shorter diameter of the first particles 43 is preferably in the range from 30 $\mu$m to 80 $\mu$m and the average longer diameter thereof is preferably in the range from 300 $\mu$m to 1000 $\mu$m. The average diameter of the second particles 44 is preferably in the range from 1 $\mu$m to 30 $\mu$m. The mixing ratio of the second particles 44 with respect to the first particles 43 is preferably in the range from 10 to 100 in weight. This is to realize high anisotropic conductivity for this purpose.

The ratio of the first and second particles 43 and 44 with respect to the rubber material 7a is preferably in the range from 20% to 60% in volume. This is to ensure the desired elastic property of the rubber material 7a.

Next, a concrete example of the IC socket 8B according to the third embodiment is explained below.

First, the socket body 5 is formed in the same manner as the first embodiment.

Next, an electrically insulating thermosetting epoxy resin is filled into the holes 17 of the body 5 and cured under heat. The protruding part of the epoxy resin from the holes 17 are polished for planarization. Smaller holes with a diameter of 0.15 mm are formed in the epoxy resin thus cured in the holes 17 using a $CO_2$ laser. Thus, the insulating films 6 with a thickness of about 50 $\mu$m are formed on the inner faces of the holes 17.

Following this, a polystyrene resin sheet (not shown) with a thickness of approximately 40 $\mu$m is adhered onto the surface of the body 5 under pressure. Then, openings communicating with the holes 17 are formed in the polystyrene resin sheet thus adhered.

Subsequently, the first conductive particles 43 and the second conductive particles 44 are mixed together in a liquid-phase thermosetting silicone rubber, making a paste. As each of the first and second particles 43 and 44, metallic Ni particles plated with Ag are used. The mixing ratio of the combination of the particles 43 and 44 with respect to the silicone rubber is approximately 50% in volume.

Furthermore, the paste thus formed is filled into the inner spaces of the holes 17 surrounded by the insulating films 6 by a screen-printing method. The paste thus filled is then heated for curing. The protruding part of the cured paste from the spaces are polished for planarization, thereby detaching the polystyrene resin sheet. Thus, the protruding anisotropically conductive-members 47, which are made of the elastic rubber 7a and the first and second particles 43 and 44, are formed in the respective holes 17.

Finally, the socket body 5 is fixed to the guide 16 that has been formed in advance, resulting in the IC socket 8B according to the third embodiment.

The IC socket 8B according to the third embodiment is used in the following way.

Here, the IC or semiconductor device 20' to be tested, which has the LGA type package without solder balls, comprises the body 22 and the flat-plate-shaped electrodes 25 attached onto the bottom of the body 22. The socket 8B is attached to the circuit board 9 in such a way that the bottoms of the anisotropically conductive members 47 are contacted with the corresponding electrodes 10 of the board 9.

The IC 20' is tested in the same manner as the first embodiment.

Figure 8:
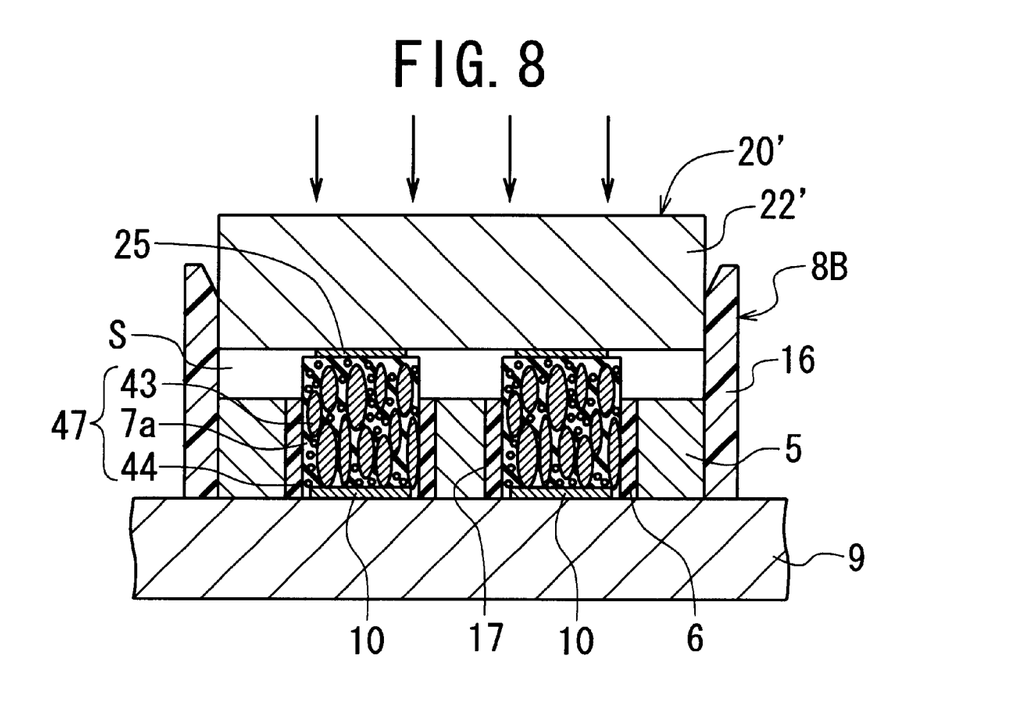
FIG. 8 is a schematic cross-sectional view showing the use of the socket according to the third embodiment of FIG. 7, which is taken along the line III—III in FIG. 2.

Specifically, first, the circuit board 9 to which the socket 8 has been attached is mounted on a testing apparatus (not shown, e.g., so-called LSI tester). Then, the IC 20' is set on the socket 8B using a transporting device for the IC 20' that is termed the handler. Specifically, the IC 20' and the socket 8B are aligned, as shown in FIG. 8, and then, the IC 20' is lowered to enter the space S in the guide 16. Thus, the electrodes or lands 25 of the IC 20' are contacted with the tops of the corresponding conductive members 47.

Thereafter, as shown in FIG. 8, a downward pressure is applied to the body 22' of the IC 20' using the handler, thereby pressing the electrodes 25 against the members 47. Due to the pressure thus applied, the rubber materials 7a of the members 47 are elastically deformed downward and at the same time, the IC 20' is shifted downward according to the elastic deformation of the materials 7a. At this time, other displacements of the IC 20' than the vertical displacement are prevented from occurring by the guide 16.

In the members 47 thus deformed, the first and second conductive particles 43 and 44 are displaced in the rubber materials 7a according to their deformation, contacting the adjoining first and second particles 43 and 44 with each other. In particular, since the first particles 43 are larger in average diameter than the second particles 44, the first particles 43 are higher in density than the second particles 44. Thus, the contact between the first and second particles 43 and 44 occurs if only the first particles 43 are moved or displaced slightly. This means that the necessary deformation of the members 47 for causing contact between the first and second particles 43 and 44 needs not so large.

When the first and second particles 43 and 44 are contacted with each other at a lot of positions, a lot of electrical paths are formed between the electrodes 25 of the IC 20' and the electrodes 10 of the circuit board 9, resulting in electrical connection between the electrodes 25 and 10. Thus, the IC 20' is held in the desired testing state where the IC 20' can be subjected to electrical evaluation or inspection.

In the testing state, specific electrical signals are supplied to the board 9 from the testing apparatus, evaluating or inspecting the IC 20'.

With the IC socket 8B according to the third embodiment of FIG. 7, as explained above, the anisotropically conductive members 47 are filled in the holes 17 of the socket body 5 to protrude therefrom while the members 47 are made of the elastic, insulating rubber material 7a, the first conductive particles 43 with a relatively larger diameter, and the second conductive particles 44 with a relatively smaller diameter. Therefore, slight deformation of the members 47 induces the contact between the first and second particles 43 and 44, thereby forming the electrical paths between the electrodes 25 and 10. Thus, the IC 20' is surely connected to the board 5.

Furthermore, since it is sufficient to induce slight deformation of the members 47, the necessary pressure applied to the members 47 (i.e., the pressure applied to the IC 20') can be reduced. Thus, the plastic deformation of the rubber material 7a of the members 47 is suppressed and at the same time, the solder waste is prevented from adhering to the material 7a. Accordingly, the durability is improved and the testing cost is lowered.

Since the socket body 5 is made of the rigid metal plate, the warping or bending of the socket 8 is prevented or suppressed. Thus, stable test can be carried out even at high temperatures.

In addition, if the socket 8B is used for a long time, the members 47 are worn down. In this case, however, it is sufficient that only the worn members 47 are replaced with new ones. This means that partial repair of the socket 8B can be realized, lowering the testing cost.

In the above-described socket 8B according to the third embodiment, the inner faces of the holes 17 are covered with the insulating resin films 6. However, the invention is not limited to this. Like the socket 8A according to the second embodiment, all the exposed areas of the body 5 may be covered with an insulating resin film.

In the sockets 8 and 8A according to the above-described first and second embodiments, the same ellipsoidal particles 43 as used in the socket 8B according to the third embodiment may be used instead of the circular particles 3, respectively.

In the first to the third embodiments, the conductive members 7 are insulated from the body 5 by the insulating resin films 6 or 36. However, the invention is not limited to these structures. If the body 5 is made of any dielectric material, it is needless to say that the films 6 and 36 are unnecessary for the sockets 8, 8A, and 8B.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. An IC socket comprising:

a socket body made of a rigid material, said body having penetrating openings:

anisotropically conductive members formed in respective openings of said body, wherein each of said anisotropically conductive members comprises an elastic insulating material, first conductive particles dispersed in said material, and second conductive particles dispersed in said material, and wherein said first and second conductive particles have a different average diameter from each other; and a guide for receiving a semiconductor device to be tested and for guiding said device toward said conductive members in said body, wherein said guide is fixed to said body in such a way that electrodes of said device are contacted with corresponding conductive members in said body such that each said electrode of said device contacts a corresponding one of said anisotropically conductive members.

2. The socket according to claim 1, wherein the anisotropically conductive members are protruded from a surface of the body in a space of the guide.

3. The socket according to claim 1, wherein the elastic, insulating material of the anisotropically conductive members is one selected from the group consisting of styrene-butadiene rubber, acrylonitrile-butadiene rubber, butadiene rubber, isoprene rubber, chloroprene rubber, butyl rubber, silicone rubber, fluorine rubber, and polyurethane rubber.

4. The socket according to claim 1, wherein each of the first and second conductive particles of the anisotropically conductive members is one selected from the group consisting of Au, Ni, Ag, Cu, and W particles, and Au-plated Ni particles.

5. The socket according to claim 1, wherein the socket body and the anisotropically conductive members are electrically insulated from each other by electrically insulating films formed on inner faces of the openings of the body.

6. The socket according to claim 5, wherein the electrically insulating film is made of one selected from the group consisting of epoxy resin, polyimide resin, styrene-butadiene rubber, acrylonitrile-butadiene rubber, butadiene rubber, isoprene rubber, chloroprene rubber, butyl rubber, silicone rubber, fluorine rubber, and polyurethane rubber.

7. The socket according to claim 1, wherein the first particles and the second particles are approximately spherical.

8. The socket according to claim 7, wherein the average diameter of the first particles is in the range from 60 $\mu$m to 200 $\mu$m while the average diameter of the second particles is in the range from 1 $\mu$m to 30 $\mu$m.

9. The socket according to claim 1, wherein the first particles are ellipsoidal.

10. The socket according to claim 9, wherein the elliposidal first particles are oriented in a direction approximately perpendicular to the electrodes of the semiconductor device.

11. The socket according to claim 9, wherein the average shorter diameter of the ellipsoidal first particles is in the range from 30 $\mu$m to 80 $\mu$m and the average longer diameter thereof is in the range from 300 $\mu$m to 1000 $\mu$m.

12. The socket according to claim 11, wherein the second particles are approximately spherical and the average diameter of the second particles is in the range from 1 $\mu$m to 30 $\mu$m.

* * * * *